(12) United States Patent
Bandiera

(10) Patent No.: US 10,665,774 B2
(45) Date of Patent: May 26, 2020

(54) MAGNETORESISTIVE ELEMENT HAVING AN ADJUSTABLE MAGNETOSTRICTION AND MAGNETIC DEVICE COMPRISING THIS MAGNETORESISTIVE ELEMENT

(71) Applicant: Crocus Technology SA, Grenoble (FR)

(72) Inventor: Sebastien Bandiera

(*) Notice: Subject to any disclaimer, the term of this patent is extended or adjusted under 35 U.S.C. 154(b) by 0 days.

(21) Appl. No.: 16/083,163

(22) PCT Filed: Mar. 6, 2017

(86) PCT No.: PCT/IB2017/051282
§ 371 (c)(1),
(2) Date: Sep. 7, 2018

(87) PCT Pub. No.: WO2017/153883
PCT Pub. Date: Sep. 14, 2017

(65) Prior Publication Data
US 2019/0036015 A1  Jan. 31, 2019

(30) Foreign Application Priority Data
Mar. 10, 2016 (EP) .................................... 16290045

(51) Int. Cl.
*G11C 11/00* (2006.01)
*H01L 43/08* (2006.01)
(Continued)

(52) U.S. Cl.
CPC ......... *H01L 43/08* (2013.01); *H01F 10/3254* (2013.01); *H01F 10/3272* (2013.01); *H01F 10/3295* (2013.01); *H01L 43/12* (2013.01)

(58) Field of Classification Search
CPC ..... H01L 43/08; H01L 43/12; H01F 10/3254; H01F 10/3272; H01F 10/3295
(Continued)

(56) References Cited
U.S. PATENT DOCUMENTS

2005/0195534 A1  9/2005  Gill
2008/0113220 A1  5/2008  Sun et al.
(Continued)

FOREIGN PATENT DOCUMENTS

JP  2006128453 A  5/2006

OTHER PUBLICATIONS

International Search Report for PCT/IB2017/051282 dated May 26, 2017.
Written Opinion for PCT/IB2017/051282 dated May 26, 2017.

*Primary Examiner* — Connie C Yoha
(74) *Attorney, Agent, or Firm* — Pearne & Gordon LLP

(57) ABSTRACT

A magnetoresistive element including: a storage layer having a first storage magnetostriction; a sense layer having a first sense magnetostriction; and a barrier layer between and in contact with the storage and sense layer. The magnetoresistive element also includes a compensating ferromagnetic layer having a second magnetostriction different from the first storage magnetostriction and/or sense magnetostriction, and adapted to compensate the first storage magnetostriction and/or the first sense magnetostriction so that a net magnetostriction of the storage layer and/or sense layer is adjustable between −10 ppm and +10 ppm or more negative than −10 ppm by adjusting a thickness of the compensating ferromagnetic layer. The present disclosure also concerns a magnetic device comprising the magnetoresistive element.

15 Claims, 6 Drawing Sheets

(51) Int. Cl.
*H01L 43/12* (2006.01)
*H01F 10/32* (2006.01)

(58) Field of Classification Search
USPC .................................................. 365/158, 145
See application file for complete search history.

(56) References Cited

U.S. PATENT DOCUMENTS

| | | |
|---|---|---|
| 2012/0061779 A1 | 3/2012 | Ohmori et al. |
| 2015/0129946 A1* | 5/2015 | Annunziata ............. H01L 43/08 257/295 |
| 2015/0340597 A1* | 11/2015 | Bandiera ............... G11C 11/161 257/421 |

* cited by examiner

MAGNETORESISTIVE ELEMENT HAVING AN ADJUSTABLE MAGNETOSTRICTION AND MAGNETIC DEVICE COMPRISING THIS MAGNETORESISTIVE ELEMENT

FIELD

The present invention concerns a magnetoresistive element having a magnetostriction that is adjustable and a magnetic device comprising the magnetoresistive element.

DESCRIPTION OF RELATED ART

Magnetic tunnel junctions are used in a wide variety of applications namely including MRAM, HDD read head and magnetic sensors.

Magnetic tunnel junctions are conventionally made of an insulating barrier, or tunnel barrier, comprising MgO or AlO. The tunnel barrier is sandwiched between two ferromagnetic layers, such as a reference or storage layer and a sense layer. The ferromagnetic layers are usually made of a Fe based alloy, such as CoFe or CoFeB.

One of the ferromagnetic layers, usually a reference layer or a storage layer, can be pinned by an antiferromagnetic layer by magnetic exchange bias coupling. The antiferromagnetic layer can comprise a Co or Fe based alloy, such as CoFe.

The reference or storage layer and the sense layer can comprise a SAF structure. Such SAF structure comprises two ferromagnetic layers that are sandwiching a non-magnetic layer, for example a Ru layer. The non-magnetic layer magnetically couples the two magnetic layers due to the RKKY coupling. The two ferromagnetic layers usually comprise an Fe based alloy, such as CoFe or CoFeB.

The ferromagnetic layers used for the reference or storage layer and sense layer, or for the SAF structures have typically a positive magnetostriction constant that is above 10 ppm. Such positive magnetostriction constant can be problematic since different metal levels or oxide/nitride layers constitutive of the layers can induce mechanical stress on the magnetic tunnel junction. Due to the magnetostriction effect, such stress change the magnetic properties of the magnetic layers.

The change in the properties are detrimental for the functioning of the device using such magnetic tunnel junctions. For example, in the case of a MRAM device, it can results in high error rate when the bits are written. In the case of sensor devices, the mechanical stress can induce a decrease of sensitivity.

Moreover, since the mechanical stresses are usually not well controlled, it results in a wide dispersion of properties among devices on a wafer, or among different wafers, resulting in a poor yield.

On the other hand, magnetic layers with negative or low magnetostriction cannot be used directly because they do not provide good electrical or magnetic properties for the magnetic tunnel junction (low TMR, low RKKY coupling, low exchange bias).

US2008113220 discloses methods and apparatus for magnetic tunnel junctions (MTJs) employing synthetic antiferromagnet (SAF) free layers. The MTJ comprises a pinned ferromagnetic (FM) layer, the SAF and a tunneling barrier therebetween. The SAF has a first higher spin polarization FM layer proximate the tunneling barrier and a second FM layer desirably separated from the first FM layer by a coupling layer with magnetostriction adapted to compensate the magnetostriction of the first FM layer. Such compensation reduces the net magnetostriction of the SAF to near zero even with high spin polarization proximate the tunneling barrier. Higher magnetoresistance ratios (MRs) are obtained without adverse affect on other MTJ properties; NiFe combinations are desirable for the first and second free FM layers, with more Fe in the first free layer and less Fe in the second free layer. CoFeB and NiFeCo are also useful in the free layers.

SUMMARY

The present disclosure concerns a magnetoresistive element comprising: a storage layer having a first storage magnetostriction; a sense layer having a first sense magnetostriction; a barrier layer between and in contact with the storage and sense layer; wherein the magnetoresistive element further comprises a compensating ferromagnetic layer having a second magnetostriction different from the first storage magnetostriction and/or sense magnetostriction, and adapted to compensate the first storage magnetostriction and/or the first sense magnetostriction so that a net magnetostriction of the storage layer and/or sense layer is adjustable between −10 ppm et +10 ppm or more negative than −10 ppm by adjusting a thickness of the compensating ferromagnetic layer.

The present disclosure further concerns a magnetic device comprising the magnetoresistive element. The magnetic device can comprise a MRAM based device, a sensor device, a HDD read head device or any other magnetic device suing the magnetoresistive element.

An advantage of the magnetoresistive element disclosed herein is that the net magnetostriction is between −10 ppm et +10 ppm, the magnetic properties of the magnetoresistive element do not depend on the stress experienced on the of the magnetoresistive element and/or on a device comprising the magnetoresistive element. The magnetoresistive element and a device comprising the magnetoresistive element has improved magnetic properties and lower properties dispersions.

The adjusting the thickness of the compensating ferromagnetic layer can be done such that the net magnetostriction is negative (more negative than −10 ppm). This results in an stress-induced magnetic anisotropy on at least one of the sense layer and the storage layer such as to provide a stress-induced magnetic anisotropy.

BRIEF DESCRIPTION OF THE DRAWINGS

The disclosure will be better understood with the aid of the description of an embodiment given by way of example and illustrated by the figures, in which.

DETAILED DESCRIPTION OF POSSIBLE EMBODIMENTS

Figure 1:
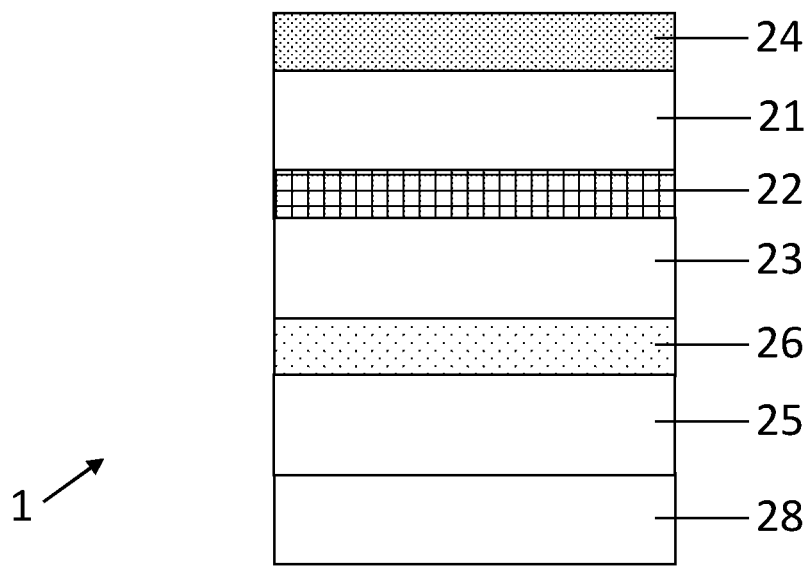
FIG. 1 represents a magnetoresistive element, according to an embodiment.

FIG. 1 represents a magnetoresistive element 1 according to an embodiment. The magnetoresistive element comprises a storage, or reference, layer 21 having a first storage magnetostriction $\lambda_{R1}$, a sense layer 23 having a first sense magnetostriction $\lambda_{S1}$, and a barrier layer 22 between and in contact with the storage and sense layer 21, 23.

Each of the storage layer 21 and the sense layer 23 includes, or is formed of, a magnetic material and, in particular, a magnetic material of the ferromagnetic type. A ferromagnetic material can be characterized by a substantially planar magnetization with a particular coercivity, which is indicative of a magnitude of a magnetic field to reverse the magnetization after it is driven to saturation in one direction. In general, storage layer 21 and the sense layer 23 can include the same ferromagnetic material or different ferromagnetic materials. Suitable ferromagnetic materials include transition metals, rare earth elements, and their alloys, either with or without main group elements. For example, suitable ferromagnetic materials include iron ("Fe"), cobalt ("Co"), nickel ("Ni"), and their alloys, such as permalloy (or Ni80Fe20); alloys based on Ni, Fe, and boron ("B"); Co90Fe10; and alloys based on Co, Fe, and B. In some instances, alloys based on Ni and Fe (and optionally B) can have a smaller coercivity than alloys based on Co and Fe (and optionally B).

Preferably, the storage layer 21 and/or the sense layer 23 comprises a Fe based alloy providing a TMR ratio greater than 20%.

The storage layer 21 can include a hard ferromagnetic material, namely one having a relatively high coercivity, such as greater than about 50 Oe. The sense layer 23 can include a soft ferromagnetic material, namely one having a relatively low coercivity, such as no greater than about 50 Oe. In such manner, a magnetization of the sense layer 23 can be readily varied under low-intensity magnetic fields during read operations, while a magnetization of the storage, or reference, layer 21 remains stable.

A thickness of each of the storage layer 21 and the sense layer 23 can be in the nanometer ("nm") range, such as from about 0.5 nm to about 10 nm. A thickness of each of the storage layer 21 and the sense layer 23 is preferably from about 0.5 nm to about 5 nm and more and preferably between 1 nm and 2.5 nm.

The barrier layer 22 includes, or is formed of, an insulating material. Suitable insulating materials include oxides, such as aluminum oxide (e.g., $Al_2O_3$) and magnesium oxide (e.g., MgO). A thickness of the barrier layer 22 can be in the nm range, such as from about 0.5 nm to about 10 nm.

The magnetoresistive element 1 further comprises a compensating ferromagnetic layer 25 included between an electrode 28 and the sense layer 23, such that the sense layer 23 is between the compensating ferromagnetic layer 25 and the barrier layer 22 with which it is in contact. The compensating ferromagnetic layer 25 has a second magnetostriction $\lambda_2$, different from the first sense magnetostriction $\lambda_{S1}$. The compensating ferromagnetic layer 25 is adapted to compensate the first sense magnetostriction $\lambda_{S1}$.

The compensating ferromagnetic layer 25 can comprise a Ni or Co alloy containing less than 25% wt of Ta, Ti, Hf, Cr, Sc, Cu, Pt, Pd, Ag, Mo, Zr, W, Al, Si, Mg or any combinations of these elements. The compensating ferromagnetic layer 25 can also comprise pure Ni or pure Co. Here, pure Ni and pure Co can mean at least 99.9% wt Ni and at least 99.9% Co, respectively. The compensating ferromagnetic layer 25 has a thickness being typically between 0.5 nm and 10 nm.

The net magnetostriction $\lambda_{net}$ of the sense layer 23 can be adjusted between −10 ppm et +10 ppm or to a more negative magnetostriction than −10 ppm by adjusting a thickness of the compensating ferromagnetic layer 25.

Figure 2:
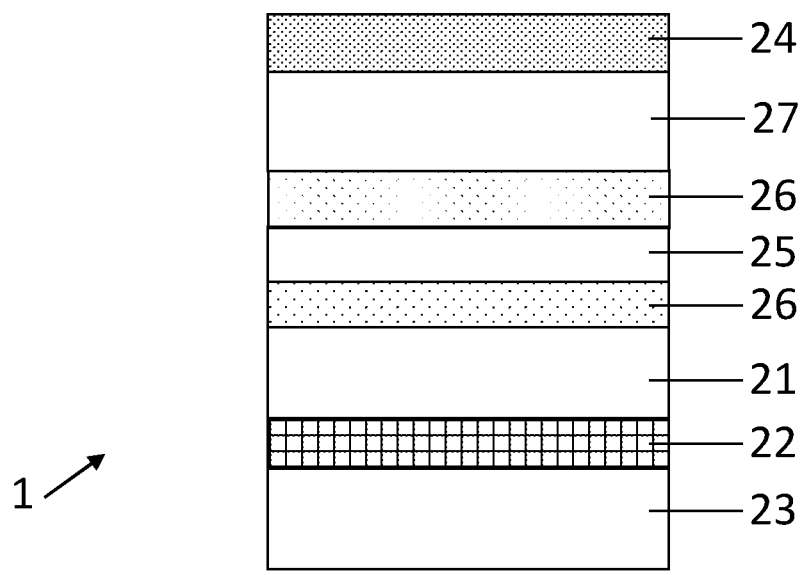
FIG. 2 illustrates a the magnetoresistive element, according to another embodiment.

FIG. 2 illustrates a variant of the magnetoresistive element 1 where the compensating ferromagnetic layer 25 is included on the other side of the barrier layer 22 such that the storage layer 21 is between the compensating ferromagnetic layer 25 and the barrier layer 22 with which it is in contact. The second magnetostriction $\lambda_2$ of the compensating ferromagnetic layer 25 differs from the first storage magnetostriction $\lambda_{R1}$ and the compensating ferromagnetic layer 25 is adapted to compensate the first storage magnetostriction $\lambda_{R1}$.

In fact, the net magnetostriction $\lambda_{net}$ of the storage and/or sense layer 21, 23 can be adjusted between −10 ppm et +10 ppm or to a more negative magnetostriction than −10 ppm by adjusting the thickness of the compensating ferromagnetic layer 25 and/or the thickness of the storage and/or sense layer 21, 23.

Preferably, the second magnetostriction $\lambda_2$ of the compensating ferromagnetic layer 25 is negative and the first storage and sense magnetostriction $\lambda_{R1}$, $\lambda_{S1}$ is positive.

Adjusting the thickness of the compensating ferromagnetic layer 25 such that the net magnetostriction $\lambda_{net}$ is negative (more negative than −10 ppm) results in providing an stress-induced magnetic anisotropy on at least one of the sense layer 23 and the storage layer 21 and provide a stress-induced magnetic anisotropy, as described in yet unpublished European patent application number EP20150290013 by the present applicant.

In order to allow a structural transition between the layers having a negative magnetostriction (the compensating ferromagnetic layer 25) and the layers having a positive magnetostriction (the storage and/or sense layer 21, 23), a transition layer 26 can be included between the layers having a negative magnetostriction and the layers having a positive magnetostriction. The transition layer 26 can comprise Ti, Hf, Ta, Nb, Cr or any combinations of these elements. The transition layer 26 should be thin enough so that a magnetic coupling still exists between the layers having a negative magnetostriction and the layers having a positive magnetostriction. Preferably, the transition layer 26 has a thickness comprised between 0.1 nm and 1 nm.

In the embodiment of FIG. 1, a transition layer 26 is included between compensating ferromagnetic layer 25 and the sense layer 23. In the embodiment of FIG. 2, the magnetoresistive element 1 comprises a transition layer 26 included between compensating ferromagnetic layer 25 and the storage layer 21.

As illustrated in FIG. 2, the magnetoresistive element 1 can comprise a storage antiferromagnetic layer 24 magnetically exchange coupling the storage (or reference) layer 21 such as to pin the magnetization of the storage layer 21. In an embodiment, a ferromagnetic coupling layer 27 is included between the antiferromagnetic layer 24 and the compensating ferromagnetic layer 25. The ferromagnetic coupling layer 27 can comprise a Fe or Co based alloy and have a thickness between 0.2 nm and 5 nm and preferably between 0.5 nm and 1.5 nm.

The ferromagnetic coupling layer 27 is adapted for providing a magnetic exchange coupling greater than 0.05 erg/cm². For example, the ferromagnetic coupling layer 27 can provide an exchange coupling that is greater than 0.05 erg/cm² between the storage antiferromagnetic layer 24 and the storage layer 21.

A transition layer 26 can further be included between the compensating ferromagnetic layer 25 and the ferromagnetic coupling layer 27.

Figure 3:
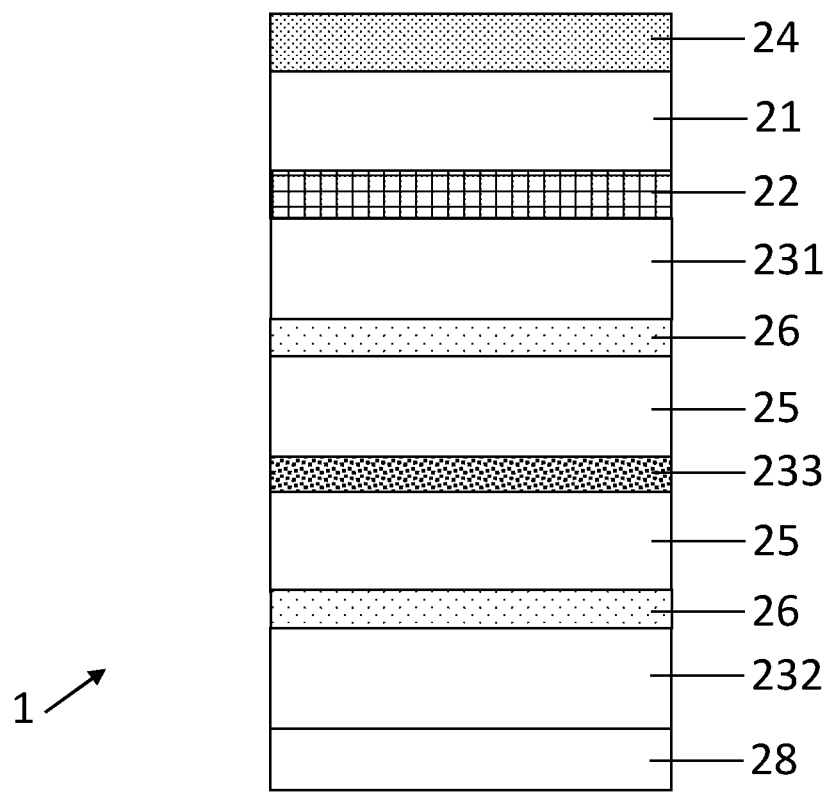
FIG. 3 shows the magnetoresistive element comprising a sense layer having a SAF structure, according to an embodiment.

FIG. 3 shows the magnetoresistive element according to another embodiment wherein the sense layer comprises a SAF structure including a first ferromagnetic sense layer 231 in contact with the barrier layer 22, a second ferromagnetic sense layer 232, and a SAF sense coupling layer 233 between the first and second ferromagnetic sense layers 231, 232. A compensating ferromagnetic layer 25 is included between the SAF sense coupling layer 233 and the first ferromagnetic sense layer 231. Another compensating ferromagnetic layer 25 is included between the SAF sense coupling layer 233 and the second ferromagnetic sense layer 232.

A transition layer 26 can be inserted between the compensating ferromagnetic layer 25 and the first ferromagnetic sense layer 231 and/or between the compensating ferromagnetic layer 25 and the second ferromagnetic sense layer 232.

Figure 4:
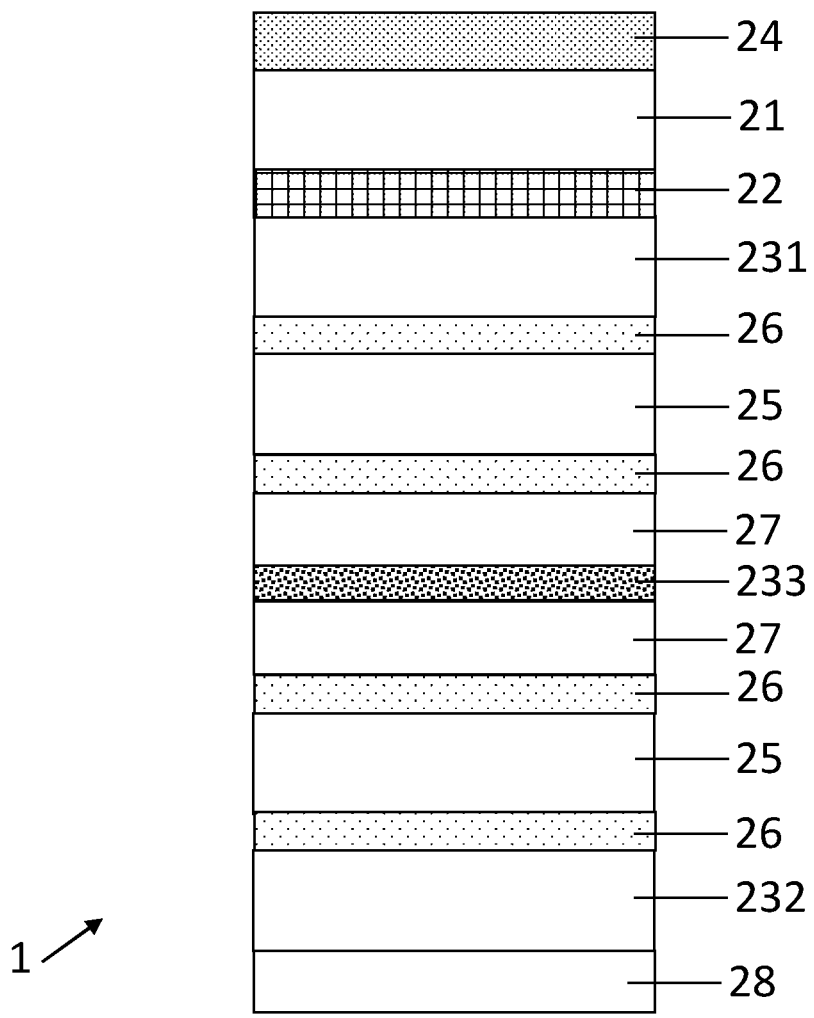
FIG. 4 shows the magnetoresistive element of FIG. 3, according to another embodiment.

FIG. 4 shows the magnetoresistive element of FIG. 3, according to another embodiment. In the configuration of FIG. 4, the magnetoresistive element 1 comprises a ferromagnetic coupling layer 27 between the SAF sense coupling layer 233 and each of the compensating ferromagnetic layers 25. The ferromagnetic coupling layer 27 enhances the RKKY-type magnetic exchange coupling between the first ferromagnetic sense layer 231 and of the second ferromagnetic sense layer 232 to a value above 0.05 erg/cm³.

A transition layer 26 can be included between the ferromagnetic coupling layer 27 and each of the compensating ferromagnetic layers 25.

Figure 5:
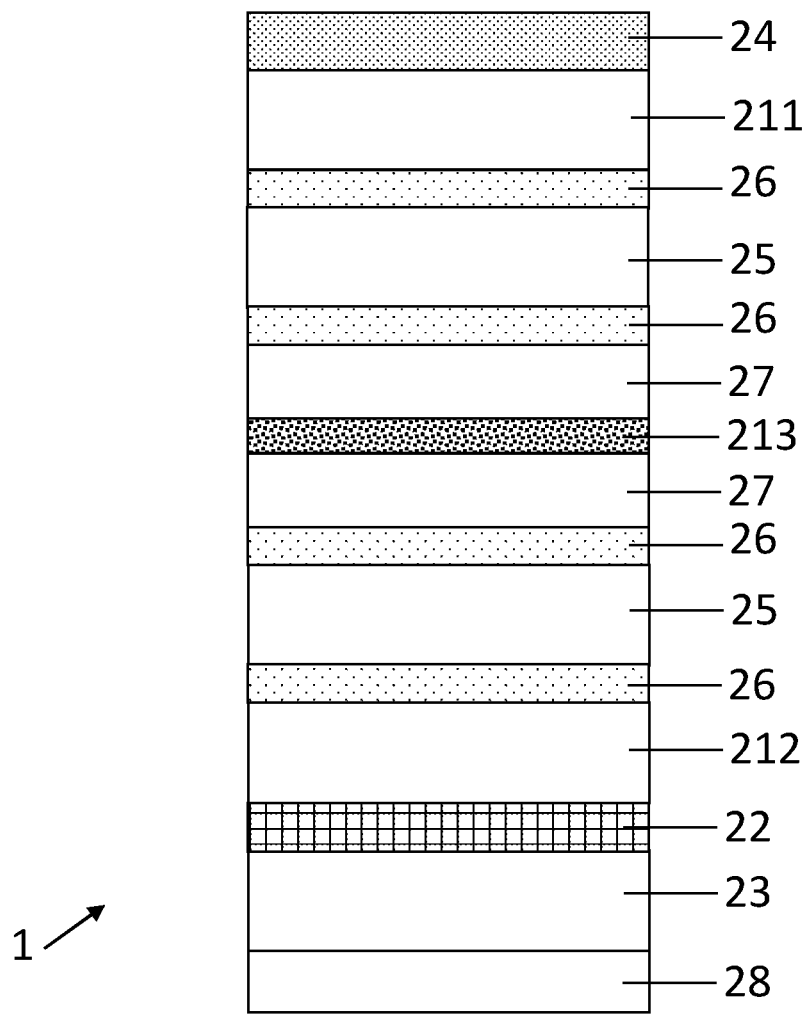
FIG. 5 represents the magnetoresistive element according to another embodiment wherein the storage layer comprises a SAF structure, according to an embodiment.

FIG. 5 shows the magnetoresistive element according to another embodiment wherein the storage layer comprises a SAF structure including a first ferromagnetic storage layer 211 in contact with the barrier layer 22, a second ferromagnetic storage layer 212, and a SAF storage coupling layer 213 between the first and second ferromagnetic storage layers 211, 212. A compensating ferromagnetic layer 25 is included between the SAF storage coupling layer 213 and the first ferromagnetic storage layer 211. Another compensating ferromagnetic layer 25 is included between the SAF storage coupling layer 213 and the second ferromagnetic storage layer 212.

A transition layer 26 can be inserted between the compensating ferromagnetic layer 25 and the first ferromagnetic storage layer 211 and/or between the compensating ferromagnetic layer 25 and the second ferromagnetic storage layer 212.

A ferromagnetic coupling layer 27 can be included between the SAF storage coupling layer 213 and each of the compensating ferromagnetic layers 25. The ferromagnetic coupling layer 27 enhances the RKKY-type magnetic exchange coupling between the first ferromagnetic storage layer 211 and of the second ferromagnetic storage layer 212 to a value above 0.05 erg/cm³.

A transition layer 26 can be included between the ferromagnetic coupling layer 27 and each of the compensating ferromagnetic layers 25.

Figure 6:
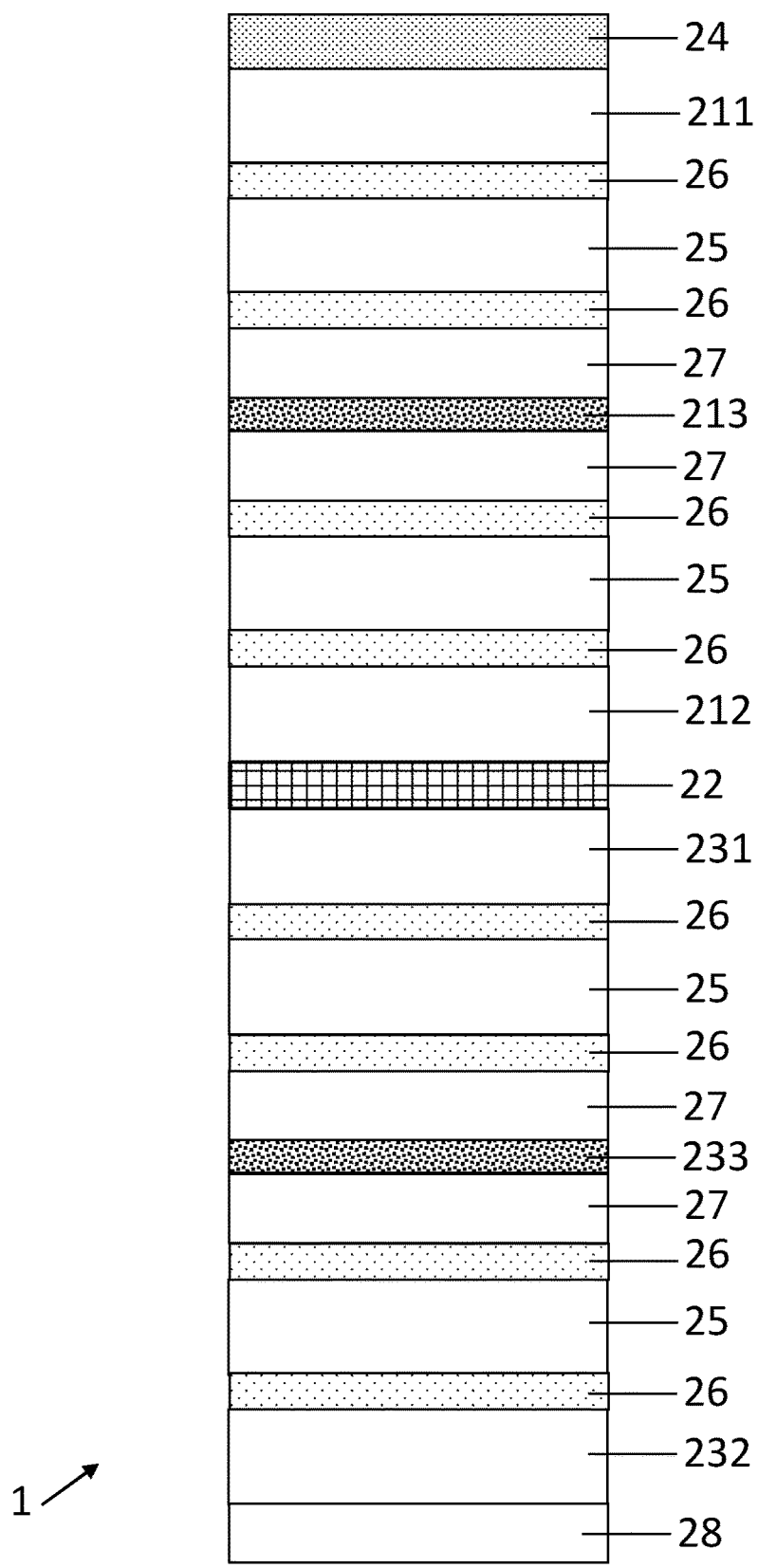
FIG. 6 illustrates a magnetoresistive element wherein both the storage layer and the sense layer comprise a SAF structure.

FIG. 6 illustrates a magnetoresistive element 1 wherein both the storage layer 21 and the sense layer 23 comprise a SAF structure, such that the magnetoresistive element 1 corresponds to a combination of the SAF sense structure of FIG. 4 and of the SAF storage structure of FIG. 5.

Figure 7:
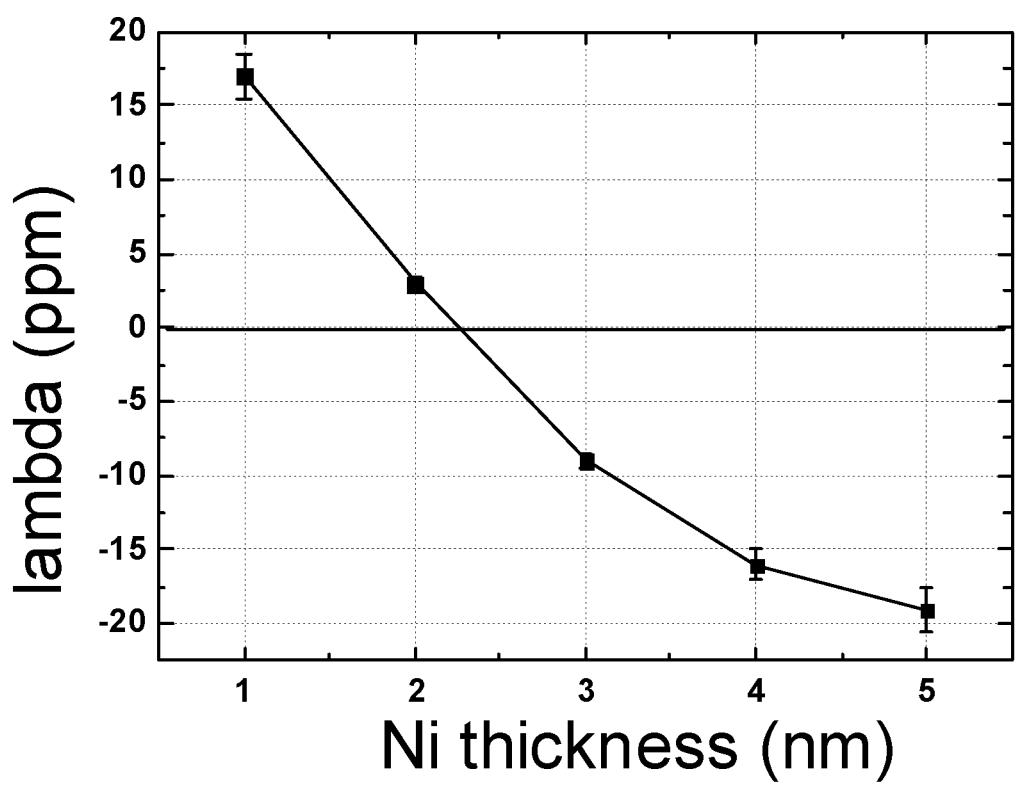
FIG. 7 represents the evolution of a net magnetostriction of a portion of the magnetoresistive element.

FIG. 7 represents the evolution of the net magnetostriction $\lambda_{net}$ of a portion of the magnetoresistive element comprising the sequence of layers Ta/Ni/Ta0.3/CoFeB1.5/MgO (corresponding to the sequence: electrode 28, compensating ferromagnetic layers 25, transition layer 26, sense layer 23 and barrier layer 22. The net magnetostriction $\lambda_{net}$ continuously decreases as a function of the thickness of the compensating ferromagnetic layers 25 comprising Ni. The net magnetostriction $\lambda_{net}$ can be cancelled when the thickness of the compensating ferromagnetic layers 25 is about 2.3 nm.

REFERENCE NUMBERS AND SYMBOLS

1 magnetoresitive element
21 storage layer
211 first ferromagnetic storage layer
212 second ferromagnetic storage layer
213 SAF storage coupling layer
22 barrier layer
23 sense layer
231 first ferromagnetic sense layer
232 second ferromagnetic sense layer
233 SAF sense coupling layer
24 storage antiferromagnetic layer
25 compensating ferromagnetic layer
26 transition layer
27 ferromagnetic coupling layer
28 electrode
$\lambda_{R1}$ first storage magnetostriction
$\lambda_{S1}$ first sense magnetostriction
$\lambda_2$ second magnetostriction
$\lambda_{net}$ net magnetostriction

The invention claimed is:

1. A magnetoresistive element comprising:
a storage layer having a first storage magnetostriction;
a sense layer having a first sense magnetostriction;
a barrier layer between and in contact with the storage and sense layers; and
a compensating ferromagnetic layer having a second magnetostriction different from the first storage magnetostriction and/or sense magnetostriction,
wherein the thickness of the compensating ferromagnetic layer is such that the second magnetostriction of the compensating ferromagnetic layer compensates the first storage magnetostriction and/or the first sense magnetostriction, so that a net magnetostriction of the storage layer and/or sense layer is between −10 ppm and +10 ppm or more negative than −10 ppm,
wherein the storage layer and/or sense layer is between the compensating ferromagnetic layer and the barrier layer, and
wherein the magnetoresistive element further comprises a ferromagnetic coupling layer comprising a Fe or Co based alloy and adapted for providing an exchange coupling greater than 0.00005 N/m.

2. The magnetoresistive element according to claim 1, wherein the compensating ferromagnetic layer comprises a Ni or Co alloy containing less than 25% wt of Ta, Ti, Hf, Cr, Sc, Cu, Pt, Pd, Ag, Mo, Zr, W, Al, Si, Mg or combinations thereof, or comprises pure Ni or pure Co.

3. The magnetoresistive element according to claim 2, wherein the compensating ferromagnetic layer has a thickness between 0.5 nm and 10 nm.

4. The magnetoresistive element according to claim 1, further comprising a transition layer between the compensating ferromagnetic layer and at least one of the storage layer and the sense layer.

5. The magnetoresistive element according to claim 4, wherein the transition layer comprises Ti, Hf, Ta, Nb, Cr or combinations thereof, and/or has a thickness comprised between 0.1 nm and 1 nm.

6. The magnetoresistive element according to claim 1, further comprising a storage antiferromagnetic layer exchange coupling the storage layer, and
wherein the ferromagnetic coupling layer is comprised between the storage antiferromagnetic layer and the compensating ferromagnetic layer.

7. The magnetoresistive element according to claim 1, comprising a transition layer between the compensating ferromagnetic layer and the ferromagnetic coupling layer.

8. The magnetoresistive element according to claim 1,
wherein the storage layer comprises a SAF structure including a first ferromagnetic storage layer in contact with the barrier layer, a second ferromagnetic storage layer, and a SAF storage coupling layer between the first and second ferromagnetic storage layers; and
wherein the compensating ferromagnetic layer is comprised between the SAF coupling layer and the first ferromagnetic storage layer and between the SAF coupling layer and the second ferromagnetic storage layer.

9. The magnetoresistive element according to claim 1,
wherein the sense layer comprises a SAF structure including a first ferromagnetic sense layer in contact with the barrier layer), a second ferromagnetic sense layer, and a SAF coupling layer between the first and second ferromagnetic sense layers; and
wherein the compensating ferromagnetic layer is comprised between the SAF coupling layer and the first ferromagnetic sense layer and between the SAF coupling layer and the second ferromagnetic sense layer.

10. The magnetoresistive element according to claim 8, further comprising a transition layer between the compensating ferromagnetic layer and at least one of the storage layer and the sense layer,
wherein the transition layer is comprised between the compensating ferromagnetic layer and the first ferromagnetic storage layer and/or between the compensating ferromagnetic layer and the second ferromagnetic storage layer.

11. The magnetoresistive element according claim 9, further comprising a transition layer between the compensating ferromagnetic layer and at least one of the storage layer and the sense layer,
wherein the transition layer is comprised between the compensating ferromagnetic layer and the first ferromagnetic sense layer and/or between the compensating ferromagnetic layer and the second ferromagnetic sense layer.

12. The magnetoresistive element according to claim 8, further comprising a storage antiferromagnetic layer exchange coupling the storage layer,
wherein the ferromagnetic coupling layer is comprised between the storage antiferromagnetic layer and the compensating ferromagnetic layer, and
wherein the ferromagnetic coupling layer is comprised between the SAF storage coupling layer and the compensating ferromagnetic layer.

13. The magnetoresistive element according to claim 9, further comprising a storage antiferromagnetic layer exchange coupling the storage layer,
wherein the ferromagnetic coupling layer is comprised between the storage antiferromagnetic layer and the compensating ferromagnetic layer, and
wherein another ferromagnetic coupling layer is comprised between the SAF sense coupling layer and the compensating ferromagnetic layer.

14. The magnetoresistive element according to claim 12, further comprising a transition layer between the compensating ferromagnetic layer and at least one of the storage layer and the sense layer,
wherein another transition layer is comprised between the ferromagnetic coupling layer and the compensating ferromagnetic layer.

15. A magnetic device comprising:
a magnetoresistive element comprising:
a storage layer having a first storage magnetostriction;
a sense layer having a first sense magnetostriction;
a barrier layer between and in contact with the storage and sense layers; and
a compensating ferromagnetic layer having a second magnetostriction different from the first storage magnetostriction and/or sense magnetostriction,
wherein the thickness of the compensating ferromagnetic layer is such that the second magnetostriction of the compensating ferromagnetic layer compensates the first storage magnetostriction and/or the first sense magnetostriction, so that a net magnetostriction of the storage layer and/or sense layer is between −10 ppm and +10 ppm or more negative than −10 ppm,
wherein the storage layer and/or sense layer is between the compensating ferromagnetic layer and the barrier layer, and
wherein the magnetoresistive element further comprises a ferromagnetic coupling layer comprising a Fe or Co based alloy and adapted for providing an exchange coupling greater than 0.00005 N/m.

* * * * *